(12) United States Patent
Biwa

(10) Patent No.: US 8,748,907 B2
(45) Date of Patent: Jun. 10, 2014

(54) OPTICAL COUPLING DEVICE

(75) Inventor: Takeshi Biwa, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/600,696

(22) Filed: Aug. 31, 2012

(65) Prior Publication Data

US 2013/0200397 A1  Aug. 8, 2013

(30) Foreign Application Priority Data

Feb. 3, 2012  (JP) ................................. 2012-022131

(51) Int. Cl.
  *H01L 27/15* (2006.01)
(52) U.S. Cl.
  USPC .......................................................... 257/82
(58) Field of Classification Search
  USPC .......................................................... 257/82
  See application file for complete search history.

(56) References Cited

U.S. PATENT DOCUMENTS

| | | | |
|---|---|---|---|
| 7,838,974 B2 * | 11/2010 | Poddar et al. ................. | 257/676 |
| 2002/0088845 A1 * | 7/2002 | Tanaka et al. ................. | 228/254 |
| 2008/0169478 A1 * | 7/2008 | Muranaka ....................... | 257/82 |

FOREIGN PATENT DOCUMENTS

| | | | |
|---|---|---|---|
| JP | 04-038860 | | 2/1992 |
| JP | 05110128 A | * | 4/1993 |
| JP | 11-340399 | | 12/1999 |
| JP | 11340399 A | * | 12/1999 |
| JP | 2000-323638 | | 11/2000 |
| JP | 2003008050 A | * | 1/2003 |
| JP | 2006332184 A | * | 12/2006 |

* cited by examiner

*Primary Examiner* — Anthony Ho

(74) *Attorney, Agent, or Firm* — Patterson & Sheridan, LLP

(57) ABSTRACT

According to one embodiment, a semiconductor device includes an input lead, a light emitting element, an output lead, a light receiving element and a resin molded body. The input lead includes an input inner lead portion, an input outer lead portion and a first silver layer. The light emitting element is provided on the first silver layer. The output lead includes an output inner lead portion, an output outer lead portion and a second silver layer. The second silver layer includes an upper surface portion and a side surface portion. The light receiving element is provided on the second silver layer and is capable of receiving light. The output lead includes a cutting surface extending from the side surface portion of the second silver layer to the side surface of the output inner lead portion. The resin molded body covers the cutting surface.

16 Claims, 9 Drawing Sheets

A          B

OPTICAL COUPLING DEVICE

CROSS-REFERENCE TO RELATED APPLICATIONS

This application is based upon and claims the benefit of priority from the prior Japanese Patent Application No. 2012-022131, filed on Feb. 3, 2012; the entire contents of which are incorporated herein by reference.

FIELD

Embodiments described herein relate generally to a semiconductor device.

BACKGROUND

In a semiconductor device including a semiconductor element bonded to a lead frame, an Ag layer may be selectively provided on the surface of the lead frame. For instance, in an integrated circuit device, the Ag layer can keep good contact with the bonding wire. Furthermore, in a light emitting device, an Ag layer having high light reflectance can be provided inside to increase the light extraction efficiency.

In the case of forming the Ag layer by plating, the unnecessary region of the surface can be masked with e.g. silicon rubber. Then, only the necessary region can be selectively plated. However, the plating liquid may leak to the side surface in the thickness direction of the lead frame. This is likely to form a side surface Ag layer, i.e., an Ag layer formed on the side surface of the lead frame. In particular, in the case of downsizing the semiconductor device, the lead frame is also downsized. This makes it more difficult to suppress the occurrence of the side surface Ag layer.

The side surface Ag layer formed by plating is likely to spread on the side surface along the longitudinal direction of the lead frame. The presence of the side surface Ag layer may induce peeling of the exterior plating layer made of e.g. SnAg. Another problem is that Ag causes migration along the gap between the lead frame and the resin molded body.

DETAILED DESCRIPTION

In general, according to one embodiment, a semiconductor device with an input side and an output side being electrically isolated from each other includes an input lead, a light emitting element, an output lead, a light receiving element, and a resin molded body. The input lead includes an input inner lead portion, an input outer lead portion, and a first silver layer provided on one end portion of the input inner lead portion. The light emitting element is provided on a surface of the first silver layer. The output lead includes an output inner lead portion, an output outer lead portion protruding in a direction opposite to a protruding direction of the input outer lead portion, and a second silver layer provided on a surface of the output inner lead portion. The second silver layer includes an upper surface portion provided on an upper surface of the output inner lead portion and a side surface portion extending from the upper surface portion to a side surface of the output inner lead portion. The light receiving element is provided on the upper surface portion of the second silver layer so as to face the light emitting element and is capable of receiving light emitted from the light emitting element. The resin molded body encloses the light emitting element, the light receiving element, the input inner lead portion, and the output inner lead portion. The output lead includes a cutting surface extending from the side surface portion of the second silver layer to the side surface of the output inner lead portion. The resin molded body covers the cutting surface.

Various embodiments will be described hereinafter with reference to the accompanying drawings.

Figure 1A:
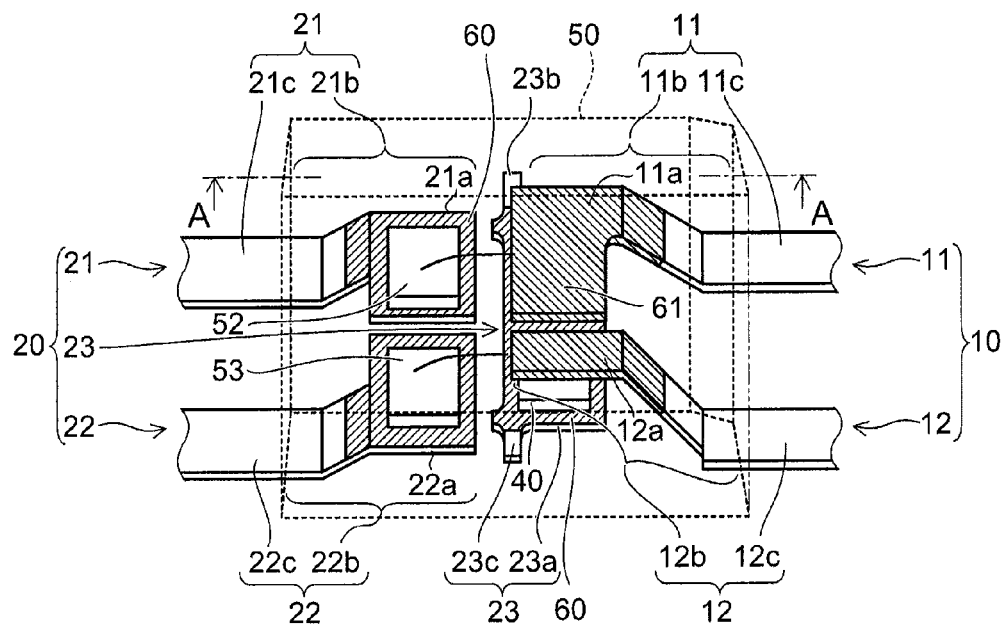
FIG. 1A is a schematic perspective view of a semiconductor device according to a first embodiment.
Figure 1B:
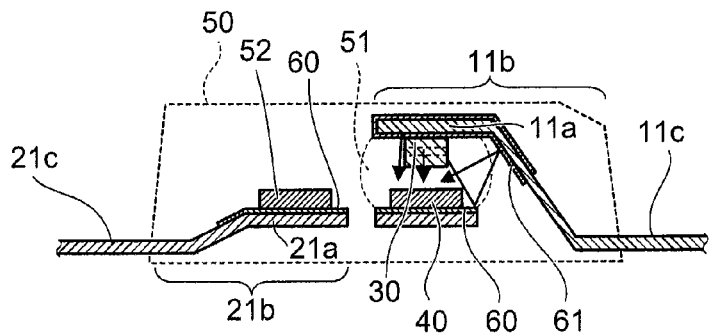
FIG. 1B is a schematic sectional view taken along line A-A.

FIG. 1A is a schematic perspective view of a semiconductor device according to a first embodiment. FIG. 1B is a schematic sectional view taken along line A-A.

The semiconductor device includes an input lead 10, a light emitting element 30, an output lead 20, a light receiving element 40, and a resin molded body 50. The resin molded body 50 is shown by dashed lines.

The input lead 10 includes a first input lead 11 and a second input lead 12. The first input lead 11 includes an inner lead portion 11b including a die pad portion 11a, an outer lead portion 11c, and a first silver (Ag) layer 61 provided on the surface of the inner lead portion 11b. The light emitting element 30 is bonded to the first Ag layer 61 provided on the die pad portion 11a.

The second input lead 12 includes an inner lead portion 12b including a bonding portion 12a, an outer lead portion 12c, and a first Ag layer 61 provided on the surface of the inner lead portion 12b. The upper electrode of the light emitting element 30 is connected to the first Ag layer 61 provided on the bonding portion 12a by a bonding wire such as an Au wire.

The output lead 20 includes a first output lead 21, a second output lead 22, and a third output lead 23. The first output lead 21 includes an inner lead portion 21b including a die pad 21a, an outer lead portion 21c, and a second Ag layer 60 provided on the surface of the die pad portion 21a. The second output lead 22 includes an inner lead portion 22b including a die pad portion 22a, an outer lead portion 22c, and a second Ag layer 60 provided on the surface of the die pad portion 22a.

The third output lead 23 includes an inner lead portion including a die pad portion 23a and suspending pins 23b, 23c, and a second Ag layer 60 provided on the surface of the die pad portion 23a. The light receiving element 40 is bonded to the upper surface of the second Ag layer 60 of the third output lead. The suspending pins 23b, 23c are leads for linking the die pad portion 23a to the output side lead frame in the lead frame state. After resin molding, the die pad portion 23a is fixed. Thus, the suspending pins 23b, 23c are cut, and the cutting surface remains around the surface of the resin molded body 50.

In FIG. 1A, the hatched portion indicates that the second Ag layer 60 and the first Ag layer 61 are provided on the surface of the lead frame. The Ag layer provided on the inner lead portion can increase the reflectance for emission light at wavelengths from visible to infrared light, and suppress leakage of incident light. Thus, the output of the light emitting element 30 can be reduced, and the light emitting element 30 can be downsized.

The bonding wire forms good ohmic contact with Ag. This can improve reliability and contact resistance. The light receiving element 40 may be a series connection of photodiodes. Then, the so-called photovoltaic output is obtained. Alternatively, the light receiving element 40 may be a light receiving IC, and its output may be connected to each gate of two MOS transistors 52, 53 for gate driving.

Figure 2:
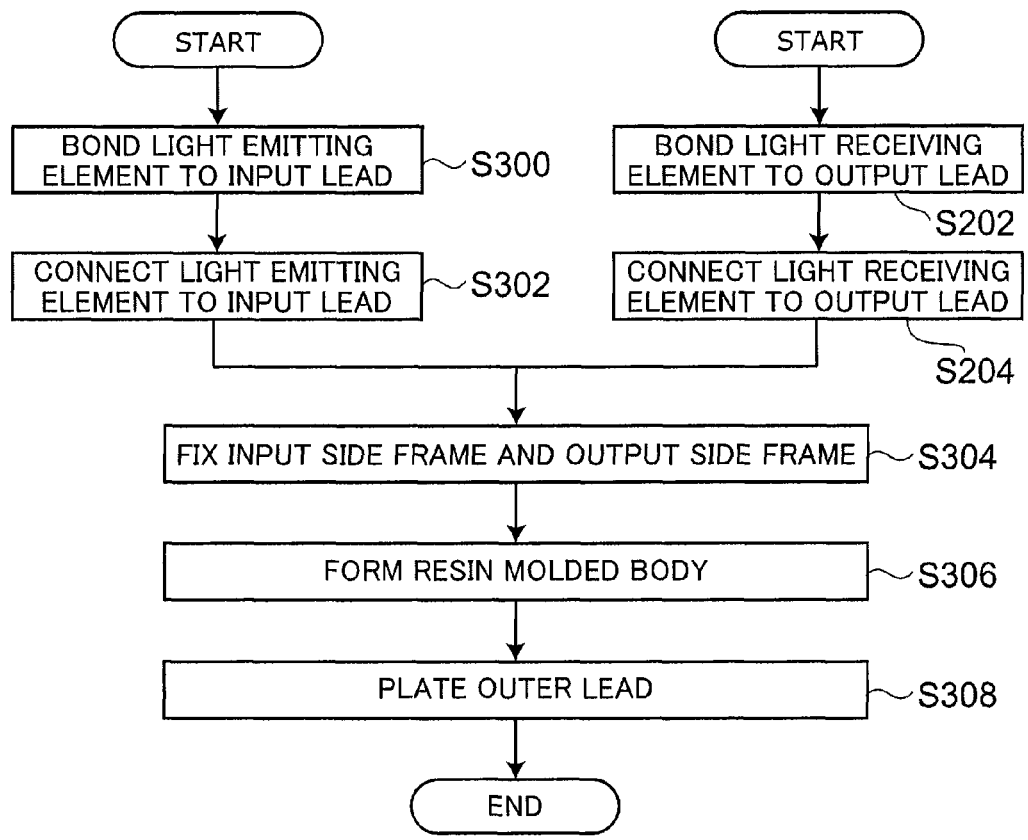
FIG. 2 is a flow chart of a method for manufacturing a semiconductor device according to the first embodiment.

FIG. 2 is a flow chart of a method for manufacturing a semiconductor device according to the first embodiment.

First, on one side of a pressed lead frame workpiece made of iron-nickel alloy or copper alloy, for instance, an Ag layer is formed by selective plating. For a selective plating mask, for instance, silicon rubber can be used. The lead of the semiconductor device is thin and narrow. Thus, the plating liquid may leak through the gap of the mask to the side surface in the thickness direction of the lead frame. The plating liquid leaked through the gap of the mask may form a side surface portion made of Ag spread from the upper surface portion.

Figure 3A:
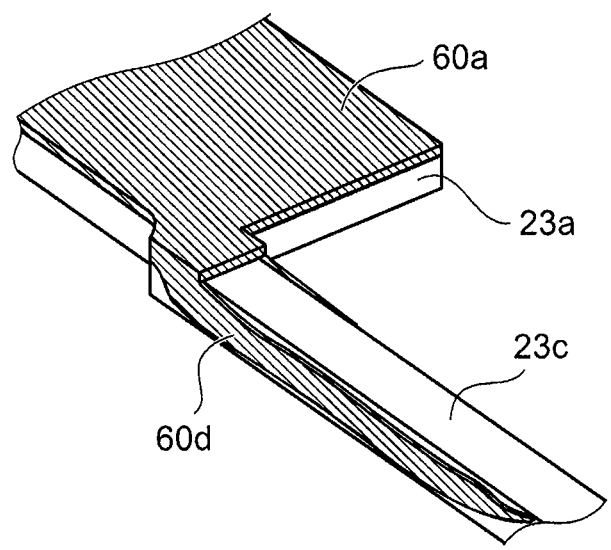
FIG. 3A is a schematic perspective view of the second Ag layer.
Figure 3B:
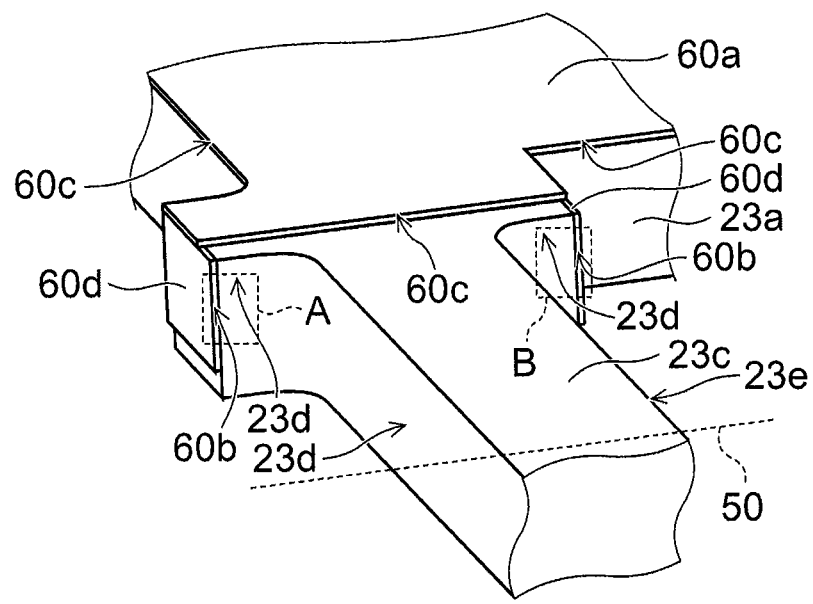
FIG. 3B is a schematic perspective view of the lead with the side surface portion removed.

FIG. 3A is a schematic perspective view of the second Ag layer. FIG. 3B is a schematic perspective view of the lead with the side surface portion removed.

As shown in FIG. 3A, the plating liquid may seep through the gap of the mask by the capillarity or bleeding phenomenon. Thus, a side surface portion 60d occurs on the side surface of the suspending pin 23c. The thickness of the suspending pin 23c can be set to e.g. 100-300 μm. Here, the hatched portion indicates the plating region. If the side surface portion 60d made of Ag is exposed to the outside of the resin molded body 50, then in the Sn or SnAg exterior plating process, phosphorus (P) and the like contained in the preprocessing agent are precipitated. This decreases the adhesiveness of the exterior plating layer and causes such problems as peeling. The suspending pin 23c may protrude e.g. approximately 0.1 mm from the surface of the resin molded body 50, and an SnAg layer prone to peeling may be attached to the side surface portion. This is undesirable.

Furthermore, during the operation of the semiconductor device, Ag may cause migration due to e.g. moisture penetrated into the gap between the resin molded body 50 and the suspending pin 23c, and migrate to the surface of the resin molded body 50. Thus, the gap spreads between the suspending pin 23c and the resin molded body 50 and decreases the adhesiveness. Furthermore, due to e.g. outside air penetrated from the gap, sulfidation of Ag, for instance, is made more likely to occur. Thus, the side surface portion 60d containing Ag remaining on the suspending pin 23c decreases the reliability of the semiconductor device.

In the first embodiment, as shown in FIG. 3B, by shaving such as press working or grinding, a cutting surface extending from the side surface portion 60d made of Ag to the side surface of the suspending pin 23c is formed. The cutting surface includes a cutting surface 60b of the side surface portion 60d of the second Ag layer 60, and a lead cutting surface 23d of the side surface of the suspending pin 23c. The grinding thickness can be set to e.g. 50-150 μm.

Figure 4A:
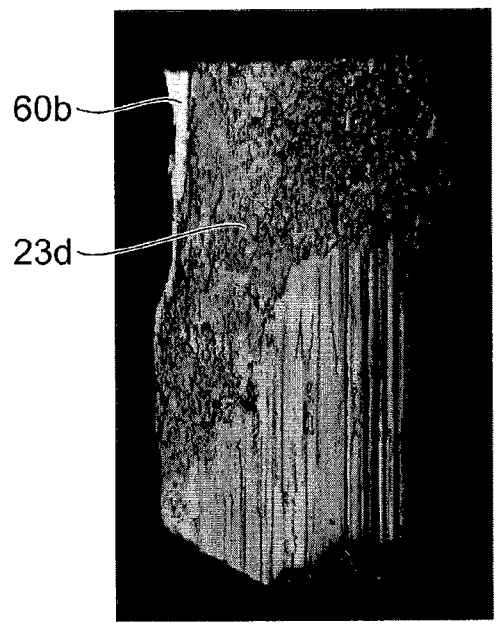
FIG. 4A is a photographic view of portion A of the cutting surface.
Figure 4B:
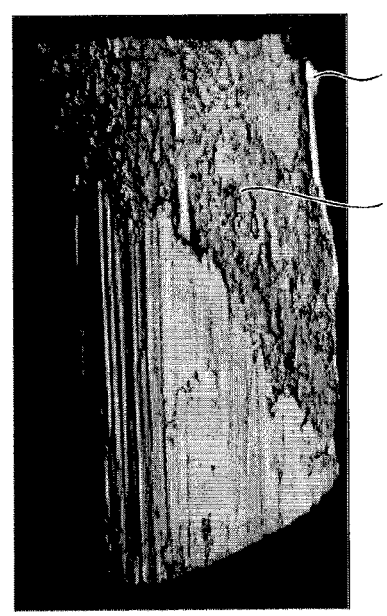
FIG. 4B is a photographic view of portion B of the cutting surface.

FIG. 4A is a photographic view of portion A of the cutting surface. FIG. 4B is a photographic view of portion B of the cutting surface.

As shown in FIGS. 4A and 4B, the side surface portion 60d extends on the side surface in the thickness direction of the lead frame. Furthermore, the end portion 60c of the upper surface portion 60a of the Ag layer 60, the shaved cutting surface 60b formed by shaving the side surface portion 60d, and the lead cutting surfaces 23d, 23e (frame material) of the suspending pin appear. The resin molded body 50 can be formed so as to cover the cutting surface 60b and the lead cutting surfaces 23d, 23e.

Figure 5A:
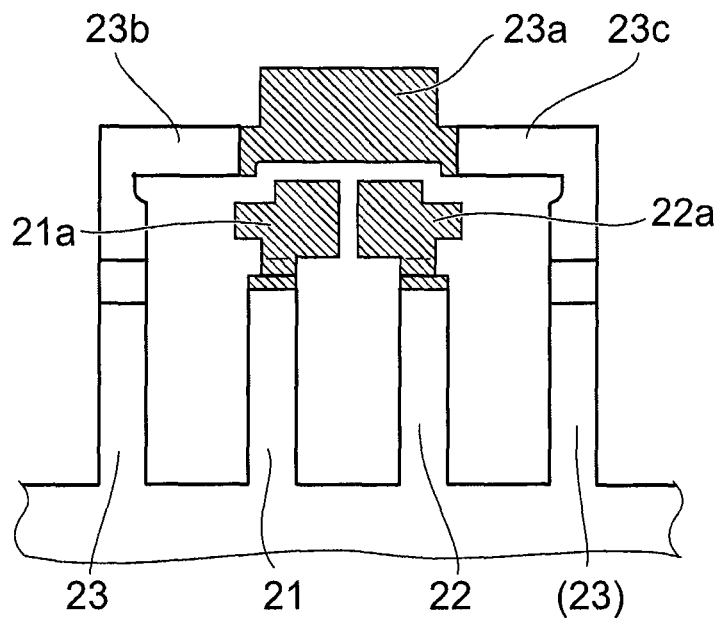
FIG. 5A is a schematic plan view of the output side lead frame before shaving.
Figure 5B:
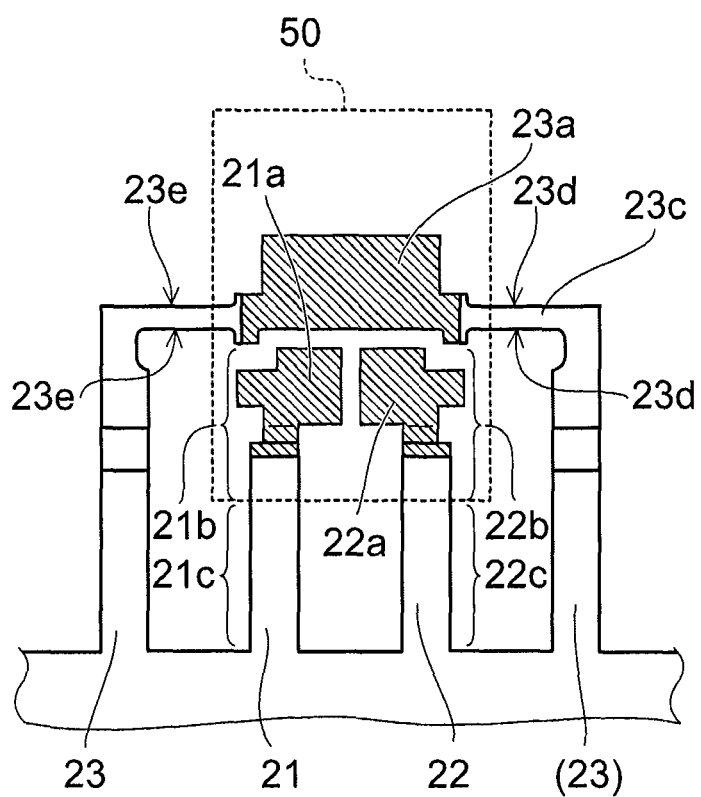
FIG. 5B is a schematic plan view after the shaving.

FIG. 5A is a schematic plan view of the output side lead frame before shaving. FIG. 5B is a schematic plan view after the shaving. The hatched portion indicates the plating region.

As shown in FIG. 5B, the side surfaces of the suspending pins 23b, 23c are each ground e.g. 50-150 μm by shaving. Thus, the lead cutting surfaces 23d, 23e made of the material of the lead frame are exposed. The resin molded body 50 has good adhesiveness to the material of the lead frame. This can increase air tightness. Furthermore, Ag is not in continuation with the outside of the resin molded body 50. This can suppress migration of Ag.

Here, the die pad portion 21a and the die pad portion 22a are intended for bonding of MOS transistors 52, 53, respectively. Thus, they can be omitted in the case where the MOS transistors 52, 53 are not provided.

After preparing the lead frame as described above, a light receiving element 40 made of e.g. Si is bonded to the surface of the second Ag layer 60 of the third output lead 23 using a conductive adhesive such as Ag paste (S202). Furthermore, the electrode of the light receiving element 40 is connected to the output lead 20 using a bonding wire made of e.g. Au (S204).

On the other hand, a light emitting element 30 made of e.g. GaAs, GaAlAs, InGaAlP, and InGaAlN is bonded to the first Ag layer 61 on the die pad portion 11a of the first input lead 11 made of iron-nickel alloy or copper alloy using a conductive adhesive such as Ag paste (S300).

The upper surface electrode of the light emitting element 30 is connected to the bonding portion 12a of the second input lead 12 using a bonding wire such as an Au wire (S302).

The light emitting element 30 can be encapsulated with a transparent resin. In this case, the first Ag layer 61 is provided on the upper surface, lower surface, and side surface of one end portion of the inner lead portion 11b of the first input lead 11 by e.g. the two-sided plating method. The encapsulation material 51 is formed so as to cover the light emitting element 30 and the first Ag layer 61, but not to directly cover the inner lead portion 11b. Thus, Cu contained in the lead frame is prevented from being in contact with the encapsulation material 51. This can reduce the influence due to migration of Cu ions and further increase the reliability of the light emitting element 30. Here, either of the step of implementing the input side lead frame and the step of implementing the output side lead frame may be performed first.

Next, the input side lead frame and the output side lead frame are aligned and fixed by e.g. welding (S304). Furthermore, molding is performed using resin such as epoxy (S306). In this case, as shown by the dashed line in FIG. 3B, the resin molded body 50 is formed so as to cover the end portion 60c of the upper surface portion 60a of the second Ag layer 60, and the end portion 60d of the side surface portion 60d.

Furthermore, as shown by the dashed line in FIG. 5B, the die pad portions 21a, 22a are similarly enclosed with the resin molded body 50.

Moreover, exterior plating is performed on the surface of the outer lead portion using e.g. Sn or SnAg (S308).

Figure 6A:
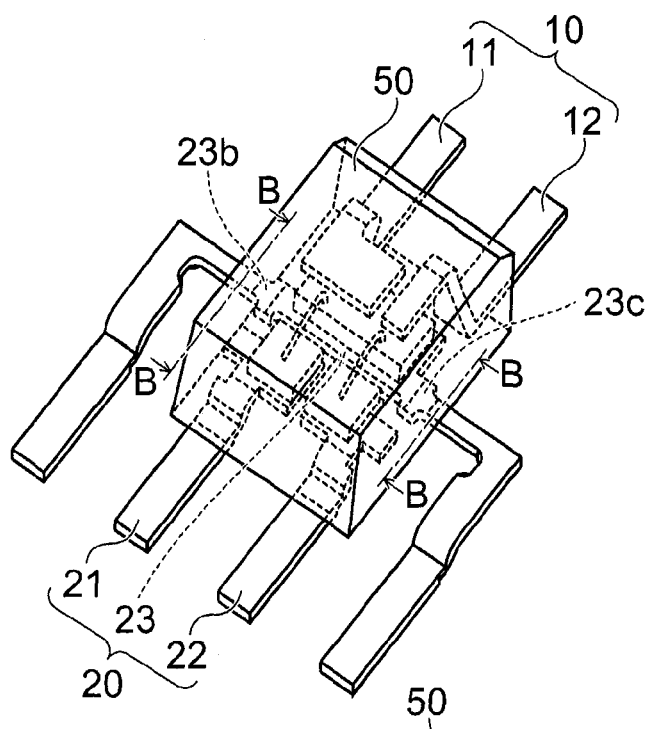
FIG. 6A is a schematic perspective view of one of the lead frames after exterior plating as viewed from above.
Figure 6B:
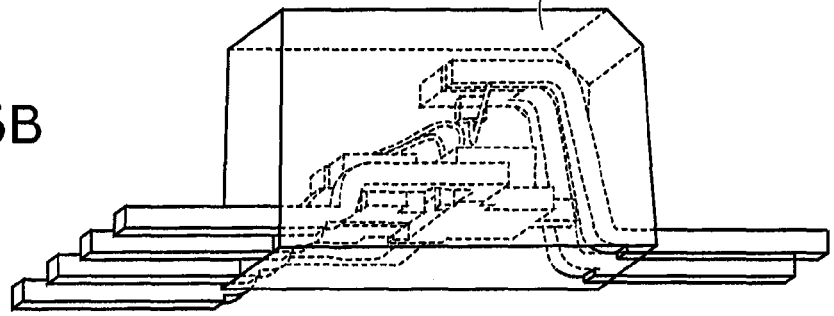
FIG. 6B is a schematic perspective view as viewed from below.
Figure 6C:
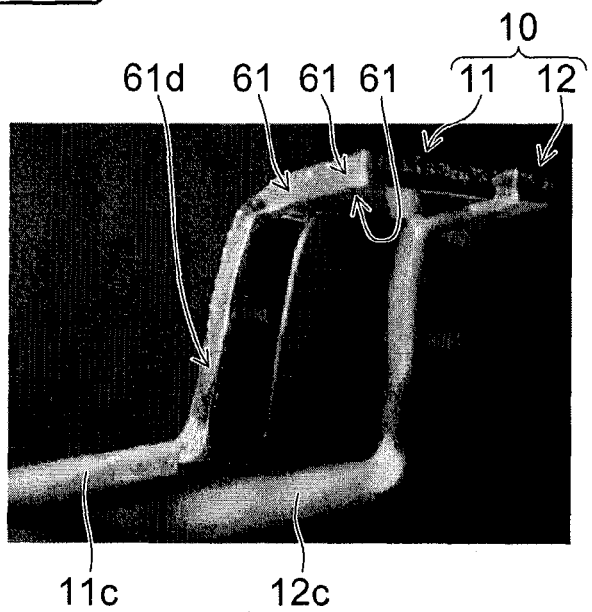
FIG. 6C is a photographic view showing the Ag plating layer of the input lead 10.

FIG. 6A is a schematic perspective view of one of the lead frames after exterior plating as viewed from above. FIG. 6B is a schematic perspective view as viewed from below. FIG. 6C is a photographic view showing the Ag plating layer of the input lead 10.

The suspending pins 23b, 23c are in the state of being linked to the lead frame. The side surface of the suspending pins 23b, 23c is shaved. Thus, Ag is not spread on the side surface. Hence, the Ag layer 60 is not exposed to the outer surface of the resin molded body 50.

In the input lead 10, the distance between the die pad portion 11a, 12a and the outer lead portion 11c, 12c is long. Thus, as shown in FIG. 6C, extension of the side surface portion 61d of the Ag layer 61 to the surface of the resin molded body 50 is successfully suppressed.

Subsequently, lead cutting is performed to separate the semiconductor device from the lead frame. In this case, the length of the outer lead portion of the input lead 10 and the output lead 20 is set to the length necessary for attachment to the mounting substrate. The suspending pins 23b, 23c are cut along line B-B. The suspending pins 23b, 23c may externally protrude e.g. 0-0.15 mm from the surface of the molded body 50. Here, the case where the suspending pins 23b, 23c are cut so as to slightly protrude outside as described above is also encompassed in the case where "the inner lead is enclosed with the resin molded body".

In the semiconductor device according to the first embodiment shown in FIGS. 1A and 1B, the input lead 10 and the output lead 20 are electrically isolated from each other. First, the light emitting element 30 performs electro-optic conversion in response to an input electrical signal. The light receiving element 40 facing the light emitting element 30 performs opto-electric conversion on the incident light. As necessary, a transimpedance circuit and the like can be incorporated to amplify the signal for output. The output can be further amplified by MOS transistors 52, 53.

The light receiving element 40 can be e.g. a photodiode or phototransistor. Alternatively, the light receiving element 40 can be a light receiving IC integrated with an amplifier circuit. Such a semiconductor device can be referred to as e.g. an optical coupling device or photocoupler. It is applicable to e.g. data transmission and communication, and can be widely used in e.g. industrial equipment, numerically controlled machine tools, and process controllers. In this case, with the increase of information capacity, the optical coupling device needs to be downsized. According to this embodiment, the Ag layer can be reliably provided. This facilitates downsizing the lead frame.

Figure 7A:
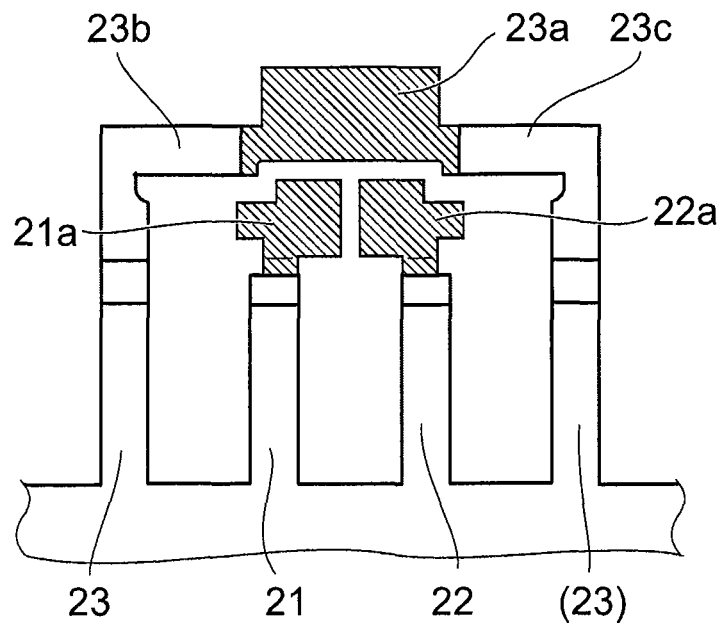
FIG. 7A is a schematic plan view of the output side frame of the semiconductor device according to the first embodiment before shaving.
Figure 7B:
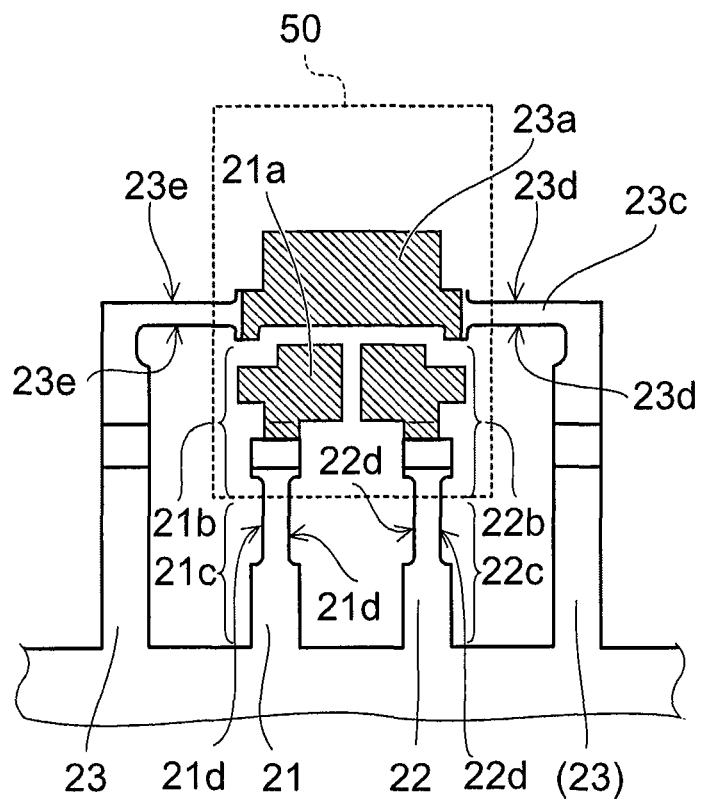
FIG. 7B is a schematic plan view of the lead frame according to a variation after shaving.

FIG. 7A is a schematic plan view of the output side frame of the semiconductor device according to the first embodiment before shaving. FIG. 7B is a schematic plan view of the lead frame according to a variation after shaving.

In FIG. 7A, the side surface portion 60d made of Ag is spread on the side surface of the suspending pins 23b, 23c, the first output lead 21, and the second output lead 22. In FIG. 7B, the first output lead 21 further includes a lead cutting surface 21d formed by shaving. Furthermore, the second output lead 22 further includes a lead cutting surface 22d formed by shaving.

In the first output lead 21 and the second output lead 22, the distance from the end portion of the second Ag layer 60 to the surface of the resin molded body 50 is longer than the distance from the end portion of the upper surface portion 60a of the second Ag layer 60 to the surface of the resin molded body 50 in the suspending pin. Thus, the side surface portion is less likely to reach the surface of the resin molded body 50. If the outer lead portion 21c of the first output lead 21 and the outer lead portion 22c of the second output lead 22 further include lead cutting surfaces 21d, 22d formed by shaving, then migration of Ag is suppressed, and short circuit between the first output lead 21 and the second output lead 22 can be further suppressed. For instance, the pitch between the leads may be set to 1.27 mm or less to downsize the package. In this case, short circuit between the leads due to migration can be further suppressed. Furthermore, peeling of exterior plating can be suppressed. Moreover, the input lead 10 may be shaved to remove the side surface portion of the first Ag layer 61.

Figure 8A:
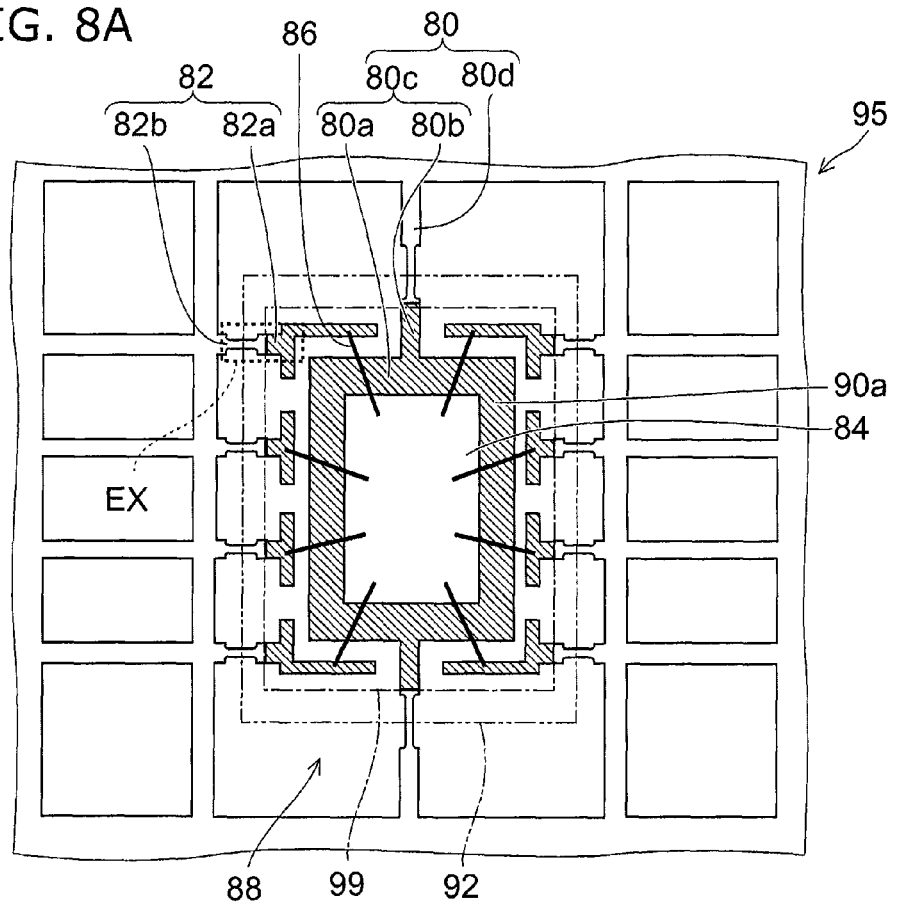
FIG. 8A is a schematic plan view of a semiconductor device according to a second embodiment before resin molding.
Figure 8B:
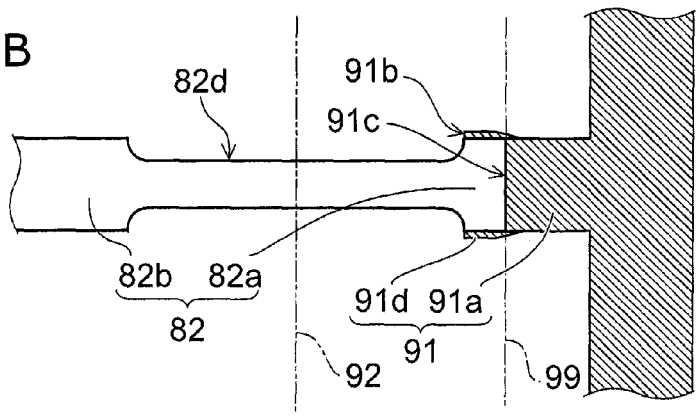
FIG. 8B is a schematic plan view with the portion EX enlarged.

FIG. 8A is a schematic plan view of a semiconductor device according to a second embodiment before resin molding. FIG. 8B is a schematic plan view with the portion EX enlarged.

The semiconductor device includes a first lead 80, a semiconductor element 84, a second lead 82, a resin molded body 92, and a bonding wire 86.

The first lead 80 includes an inner lead portion 80c including a suspending pin 80b and a die pad portion 80a, an outer lead portion 80d, and a first Ag layer 90 provided on the surface of the inner lead portion 80c. The semiconductor element 84 is bonded to the surface of the first Ag layer 90.

The second lead 82 includes an inner lead portion 82a, an outer lead portion 82b, and a second Ag layer 91 provided on the surface of the inner lead portion 82a. The second lead 82 is provided outside the die pad portion 80a. The resin molded body 92 is provided so as to enclose the semiconductor element 84, the die pad portion 80a, the suspending pin 80b, and the inner lead portion 82a of the second lead 82.

As shown in FIG. 8B, the second Ag layer 91 includes a side surface portion 91d extending from the upper surface portion 91a to the side surface of the second lead 82. The second lead 82 includes a cutting surface extending from the second side surface portion 91d of the second Ag layer 91 to the side surface of the second lead 82.

Likewise, the first Ag layer 90 includes a side surface portion extending from the upper surface portion 90a to the side surface of the first lead 80. The first lead 80 includes a cutting surface extending from the first side surface portion of the first Ag layer 90 to the side surface of the first lead. These cutting surfaces are covered with the resin molded body 92. This can suppress extension of the Ag layer to the outside of the resin molded body 92.

Figure 9:
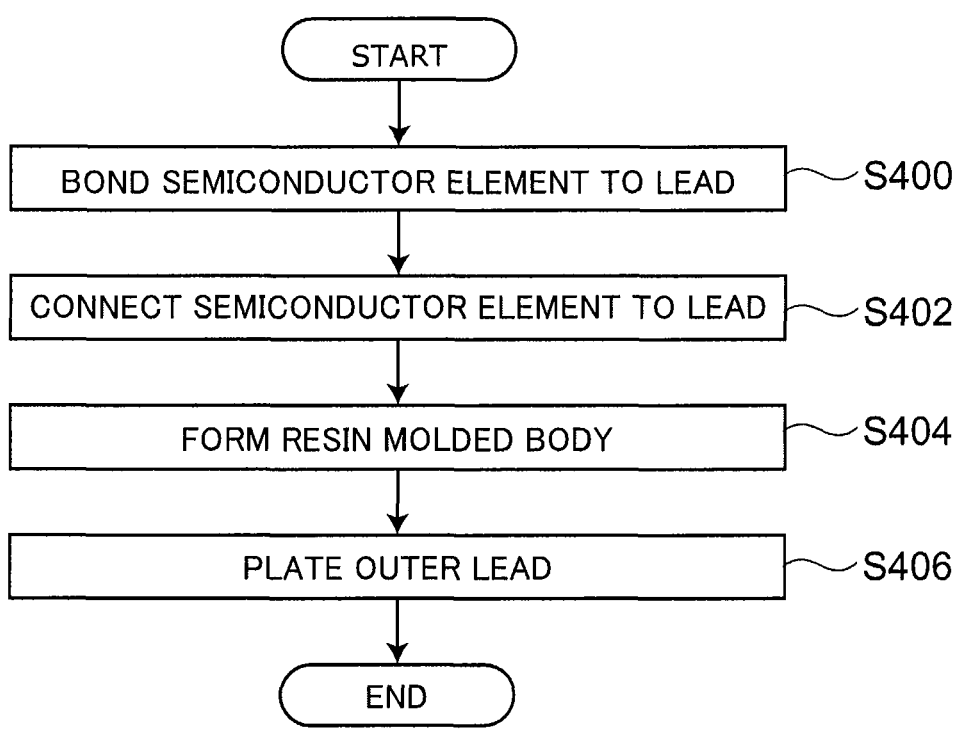
FIG. 9 is a flow chart of a manufacturing method of the second embodiment.

FIG. 9 is a flow chart of a manufacturing method of the second embodiment.

A mask is provided at a prescribed position of the lead frame 95. By plating, a first Ag layer 90 and a second Ag layer 91 are formed. The first and second Ag layers 90, 91 are indicated by hatching in FIGS. 8A and 8B. The side surface of the suspending pin 80b of the first lead 80 and the side surface of the second lead 82 are shaved to grind the side surface portion made of Ag.

A semiconductor element 84 is bonded to the lead frame thus processed (S402). Furthermore, the upper electrode of the semiconductor element 84 is connected to the inner lead 82a of the second lead 82 using a bonding wire 86 made of e.g. Au. The inner lead 82a is provided with an Ag layer formed by plating. Thus, many wires can be reliably and rapidly connected (S402).

Next, a resin molded body 92 is formed so that the resin covers the cutting surface (S404). Next, the unnecessary region of the outer lead 82 and the suspending pin are cut. As necessary, exterior plating is performed on the outer lead (S406).

In the second embodiment, the semiconductor element 84 can be e.g. a transistor, a MOS transistor, or an integrated circuit. The integrated circuit can be e.g. a digital circuit, an analog circuit, or a hybrid circuit thereof. In this case, if the narrow and short lead is plated with Ag, an unnecessary side surface portion containing Ag is formed on the side surface as in the first embodiment. Then, due to migration, Ag migrates to the outside of the resin molded body 92. However, in the second embodiment, Ag migration is suppressed, and a highly reliable semiconductor device can be achieved.

As described above, according to the first and second embodiments, peeling of exterior plating and Ag migration are suppressed. Thus, a highly reliable semiconductor device is provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An optical coupling device having an input side and an output side, comprising:
    an input lead including an input inner lead portion, an input outer lead portion, and a first silver layer provided on one end portion of the input inner lead portion;
    a light emitting element provided on a surface of the first silver layer;
    a first output lead including a first outer lead portion and a first inner lead portion;
    a second output lead including a second outer lead portion and a second inner lead portion;
    a third output lead including a first die pad portion and a suspending pin portion extending from the first die pad portion;
    a second silver layer provided on an upper surface of the first die pad portion;
    a light receiving element provided on the second silver layer so as to face the light emitting element; and
    a resin molded body enclosing the light emitting element, the light receiving element, the input inner lead portion, the first inner lead portion, the second inner lead portion, and the suspending pin,
    a side surface of the suspending pin including a shaved surface, and
    the resin molded body covering the shaved surface.

2. The device according to claim 1, further comprising:
    an encapsulation material made of a transparent resin,
    wherein the one end portion includes an upper surface, a lower surface provided on an opposite side of the upper surface and facing the upper surface of the first die pad portion, and a side surface,
    the first silver layer covers the upper surface, the lower surface, and the side surface of the one end portion,
    the light emitting element is provided on the first silver layer covering the lower surface of the one end portion, and
    the encapsulation material covers the light emitting element and the first silver layer, but does not directly cover the inner lead portion.

3. The device according to claim 2, wherein
    the input lead includes a shaved surface extending from the first silver layer provided on the side surface of the one end portion of the input lead to a side surface of the input lead, and
    the resin molded body covers the shaved surfaces.

4. The device according to claim 1, wherein the light receiving element is one of a photodiode, a phototransistor, and a light receiving IC.

5. The device according to claim 1, wherein
    the second silver layer extends to the side surface of the suspending pin, but does not extend to the shaved surface.

6. The device according to claim 5, wherein the light receiving element is one of a photodiode, a phototransistor, and a light receiving IC.

7. The device according to claim 5, wherein
    the first inner lead portion includes a second die pad portion spaced from the first die pad portion and the second silver layer is formed on the second die pad portion, and the second inner lead portion includes a third die pad portion spaced from the first die pad portion and the second silver layer is formed on the third die pad portion.

8. The device according to claim 7, further comprising:
    a first MOS transistor provided on an upper surface of the second pad portion, and
    a second MOS transistor provided on an upper surface of the third pad portion.

9. The device according to claim 7, wherein
    the first output lead has a shaved surface covered with the resin molded body, and
    the second output lead has a shaved surface covered with the resin molded body.

10. The device according to claim 7, wherein
    the light receiving element is one of a photodiode, a phototransistor, and a light receiving IC, and
    an output of the light receiving element drives gates of the first and second MOS transistors, respectively.

11. The device according to claim 1, wherein the light receiving element is a photodiode that includes a plurality of series connected diode elements, and
    photovoltaic power from the photodiode is outputted from the second outer lead portion.

12. The device according to claim 1, wherein the light emitting element is made of one of GaAs, GaAlAs, InGaAlP, and InGaAlN.

13. The device according to claim 1, wherein a layer made of one of tin and tin-silver is provided on a surface of the input outer lead portion and a surface of at least one of the first outer lead portion, the second outer lead portion and, the suspending pin portion.

14. The semiconductor device of claim 1, wherein the shaved surface on the side surface of the suspending pin is a ground edge of third output lead.

15. The semiconductor device of claim 1, wherein the suspending pin portion has a first portion that includes the shaved surface and a second portion that does not have the shaved surface, and the first portion of the suspending pin is narrower than the second portion of the suspending pin.

16. The semiconductor device of claim 15, wherein the second silver layer is on the second portion of the suspending pin and not on the first portion of the suspending pin.

* * * * *